United States Patent
Tsai et al.

(10) Patent No.: US 7,786,500 B2
(45) Date of Patent: Aug. 31, 2010

(54) LIGHT-EMITTING DIODES LAMP LENS STRUCTURE

(75) Inventors: Jing-Yi Tsai, Tucheng (TW); Chun-Chih Liang, Taipei (TW)

(73) Assignee: Everlight Electronics Co., Ltd., Taipei Hsien (TW)

( * ) Notice: Subject to any disclaimer, the term of this patent is extended or adjusted under 35 U.S.C. 154(b) by 0 days.

(21) Appl. No.: 12/061,248

(22) Filed: Apr. 2, 2008

(65) Prior Publication Data

US 2009/0014737 A1    Jan. 15, 2009

(30) Foreign Application Priority Data

Jul. 10, 2007    (TW) .............................. 96211247 U

(51) Int. Cl.
*H01L 27/108* (2006.01)
*H01L 29/94* (2006.01)

(52) U.S. Cl. ............................ 257/99; 257/98; 257/301; 257/680; 257/100; 313/503; 313/506; 313/512

(58) Field of Classification Search .................... 257/99, 257/301, 100, 680, 98; 313/498–512
See application file for complete search history.

(56) References Cited

U.S. PATENT DOCUMENTS

| | | | |
|---|---|---|---|
| 2004/0155565 A1* | 8/2004 | Holder et al. | 313/113 |
| 2005/0199898 A1* | 9/2005 | Lin et al. | 257/98 |
| 2007/0257610 A1* | 11/2007 | Shen | 313/512 |

* cited by examiner

*Primary Examiner*—Zandra Smith
*Assistant Examiner*—Telly D Green
(74) *Attorney, Agent, or Firm*—Muncy, Geissler, Olds & Lowe, PLLC

(57) ABSTRACT

The present invention is an LED lamp lens, on which orderly arranged surface plural protuberances. And with the differences of light perviousness, a particular luminous pattern of the LED lamp is displayed when the LED lamp is turned on.

5 Claims, 5 Drawing Sheets

LIGHT-EMITTING DIODES LAMP LENS STRUCTURE

RELATED APPLICATIONS

This application claims priority to Taiwan Application Serial Number 96211247, filed Jul. 10, 2007, which is herein incorporated by reference.

BACKGROUND

1. Field of Invention

The present invention relates to a light-emitting diode lamp lens structure. More particularly, the present invention relates to a light-emitting diode lamp lens structure of plural protuberances.

2. Description of Related Art

Light-Emitting Diodes (LED) are widely used in electronic devices or for lamp illumination. The general lamp with a circular surface irradiation is customarily used, though the light-emitting diode chips are arranged as arrays on the circuit panel of an LED lamp. In prior art, several light-emitting diodes are commonly used to form an LED lamp set, and LED lamp sets are arranged in round shapes to form a circular surface irradiation.

With the light decoration, the LED lamp is gradually replacing the conventional light bulb as in Christmas tree decorations, shop window decorations, ambient interior lighting, etc. But, the conventional LED lamp is packaged in a single protuberance lens making displaying different specific luminous patterns for light decorations difficult.

SUMMARY

For this reason, this invention provides an LED lamp lens structure with several protuberances on the surface of the package lens of the LED lamp. Light is emitted through lens package protuberances that have different three-dimensional shapes. The light beams are emitted out from the LED lamp with different intensities of light perviousness and color contrasts due to the different thickness of protuberances. Therefore, it is possible to display different specific luminous patterns, such as the shape or the texture of a flower petal, and a flower bud.

This invention also provides an LED lamp lens structure with several protuberances on the surface of the package lens of the LED lamp. And depending on the specifications of the manufacturer, the three-dimensional protuberance shapes on the LED lamp lens are designed as a hemisphere, a cone, a cylinder, and combinations thereof.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
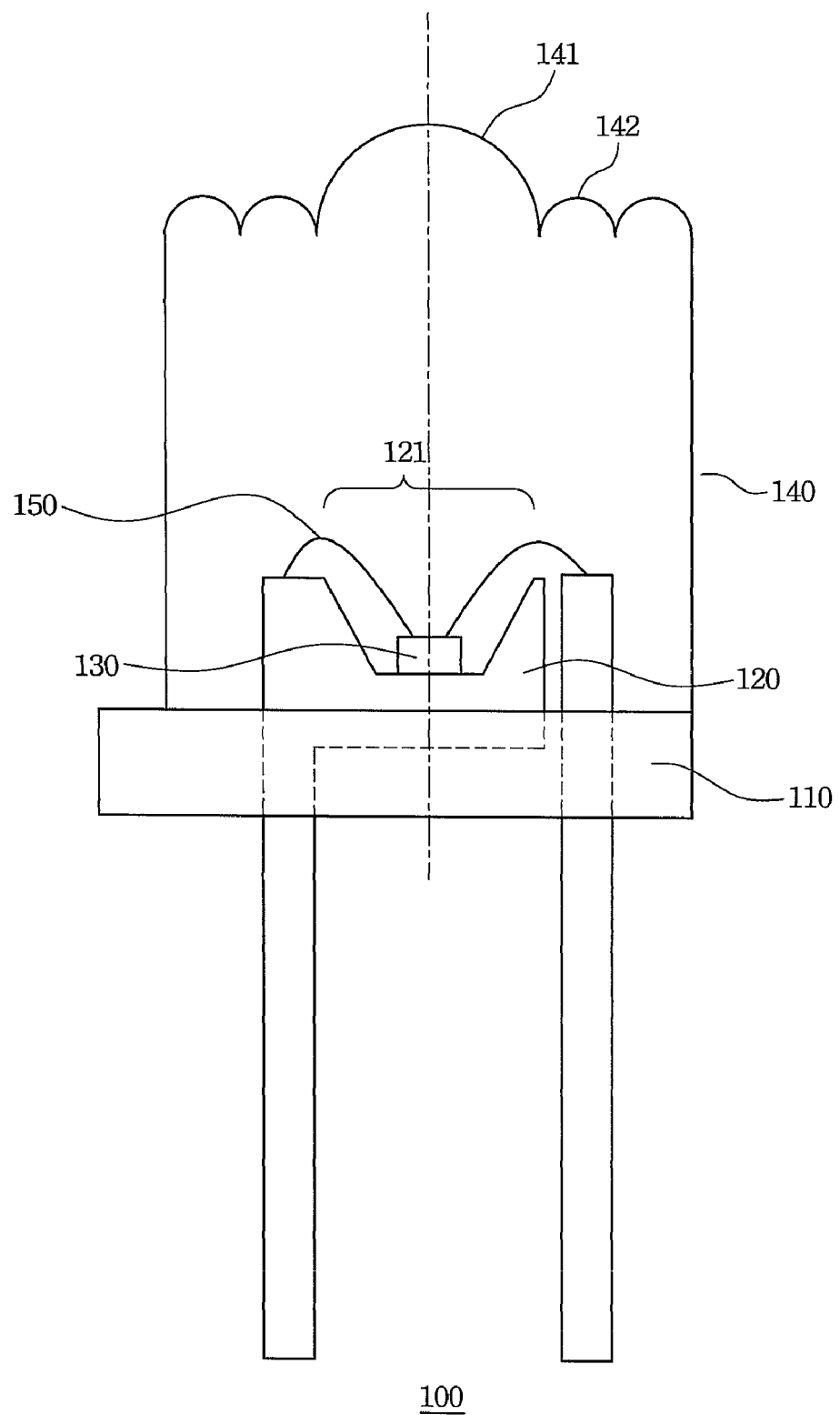
FIG. 1 illustrates the preferred embodiment of LED lamp lens structure of this invention.

Reference will now be made in detail to the present embodiments of the invention, examples of which are illustrated in the accompanying drawings. Wherever possible, the same reference numbers are used in the drawings and the description to refer to the same or like parts.

Refer to FIG. 1. FIG. 1 illustrates the preferred embodiment of an LED lamp lens structure of this invention. As shown in FIG. 1, the disclosed LED lamp 100, comprises a package base 110 with an electrically conductive stand 120 disposed thereon, and an LED chip 130, disposed on the electrically conductive stand 120 in the package base 110. The electrically conductive stand 120 has an indentation 121, where the LED chip 130 is disposed. The LED chip 130 is connected to the electrically conductive stand 120 via the conductive line 150, and is packaged under the package lens 140 in the LED lamp 100. The outer surface of the package lens 140 has a central protuberance 141 and a plurality of peripheral protuberances 142. The center of central protuberance 141 is aligned to the LED chip 130 in the package base 110 to form the package lens 140 with plural protuberances.

Figure 2:
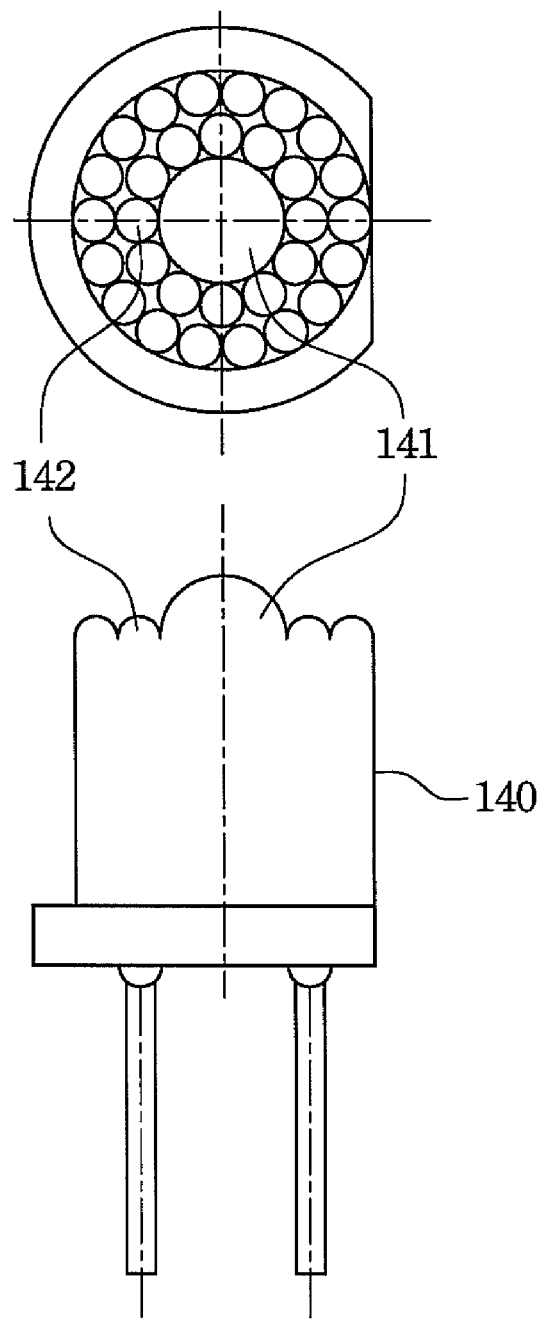
FIG. 2~FIG. 5 illustrate the three-dimensional geometry shape of the preferred embodiment of the lamp lens of this invention.
Figure 3:
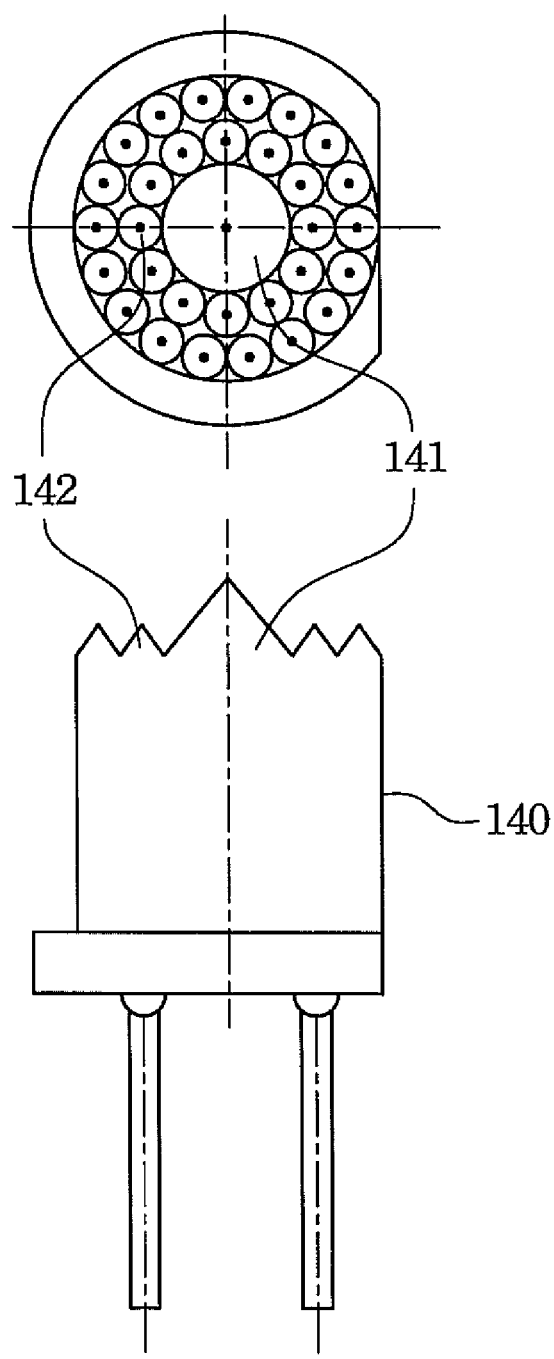
Figure 4:
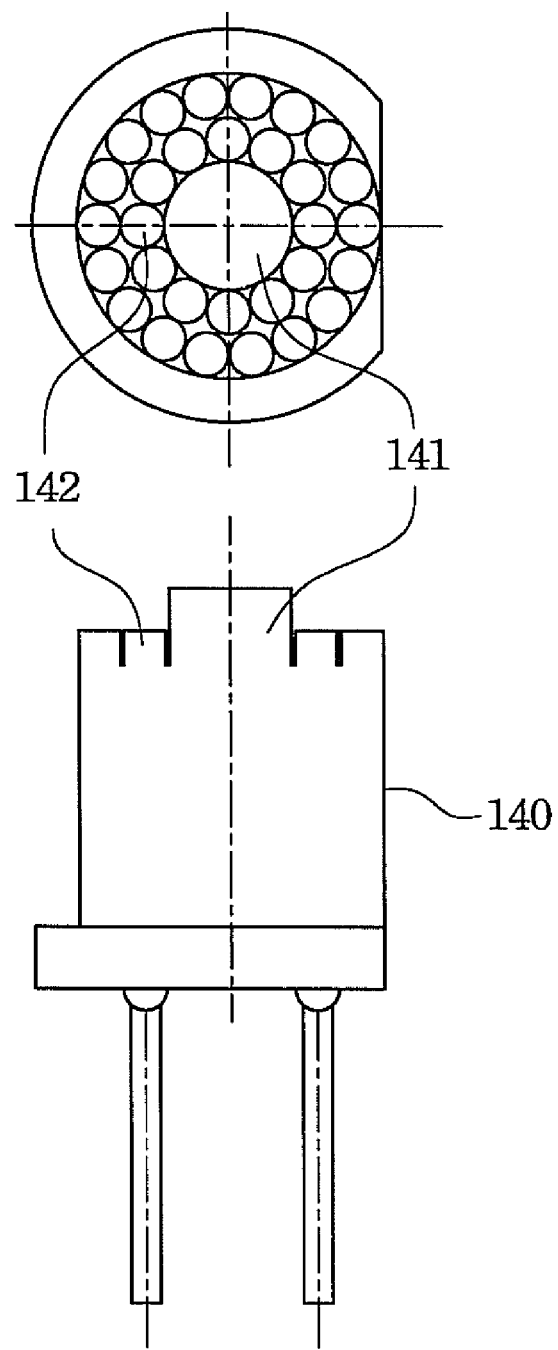
Figure 5:
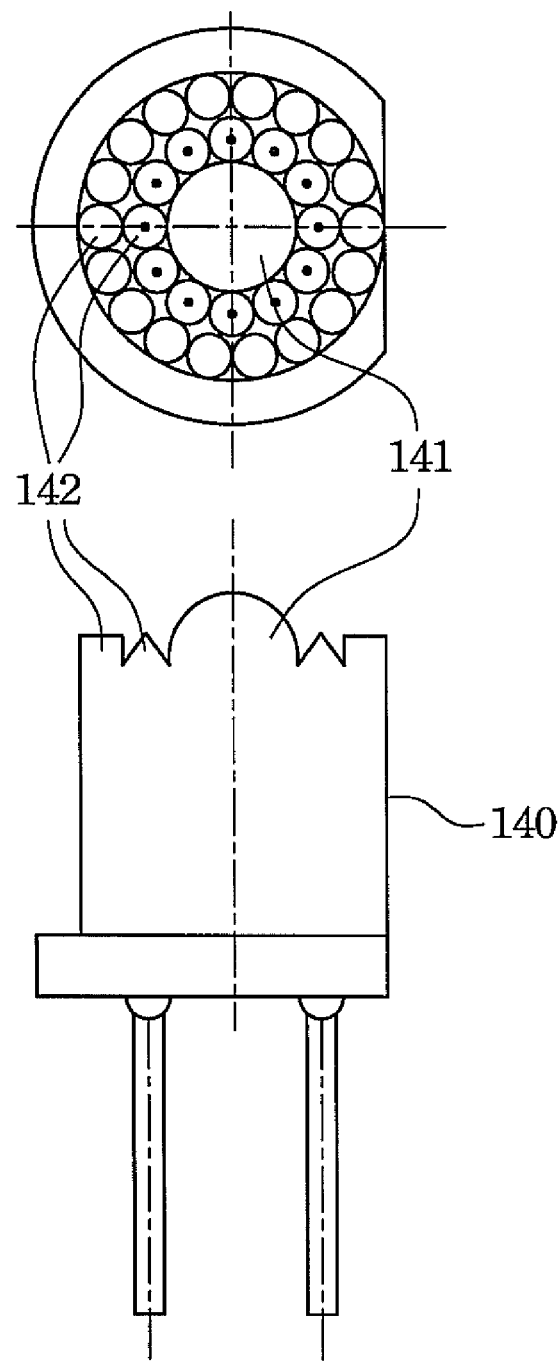

Refer to FIG. 2~FIG. 5. FIG. 2~FIG. 5 illustrate the three-dimensional geometry shape of the preferred embodiment of the lamp lens of this invention. The central protuberance 141 of the circular cross-section and the peripheral protuberance 142 of the circular cross-section are on the outer surface of the package lens 140. And the maximum radius of the circular cross-section of the peripheral protuberance 142 is less than or equal to the maximum radius of the circular cross-section of the central protuberance 141. The peripheral protuberances 142 are arranged in rings around the center of the central protuberance 141 as the circle center. Therefore, a package lens 140 with a central protuberance 141 in the center and plural rings of peripheral protuberances 142 surrounded thereon can be designed. Nevertheless, the three-dimensional shape of the central protuberance 141 and the peripheral protuberance 142 are both selected from the group of a part of a hemisphere (as shown in FIG. 2), a cone (as shown in FIG. 3), and a cylinder (as shown in FIG. 4) to form the package lens 140. Or, either one of the central protuberance 141 and the peripheral protuberances 142 is the three-dimensional shape of a part of a hemisphere, a cone, and a cylinder to form the package lens 140 (as shown in FIG. 5). Therefore, through different three-dimensional shapes of protuberances on the package lens 140, the light beams emit out from the LED lamp 100 having different intensities of light perviousness and color contrasts due to the different thickness of protuberances.

By the LED lamp lens structure of this invention, it is possible to display different specific luminous patterns of sight vision, such as the shape or the texture of a flower petal, and a flower bud.

Although the present invention has been described in considerable detail with reference certain embodiments thereof, other embodiments are possible. Therefore, their spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An LED lamp lens structure, comprising:
 a package base;
 an LED chip, disposed in the package base;
 an electrically conductive stand, disposed on the package base and connected to the LED chip; and a package lens, having a plurality of peripheral protuberances of circular cross-sections surrounding a central protuberance of a circular cross-section, wherein a maximum radius of the circular cross-section of the peripheral protuberances is less than a maximum radius of the circular cross-section of the central protuberance and the peripheral protuberances are arranged in rings around the center of the central protuberance as the circle center.

2. The LED lamp lens structure of claim 1, wherein the LED chip is disposed in the indentation of the electrically conductive stand.

3. The LED lamp lens structure of claim 1, wherein the center of the central protuberance is aligned to the LED chip in the package base.

4. The LED lamp lens structure of claim 1, wherein the three-dimensional shape of the central protuberance is selected from the group of a part of a hemisphere, a cone, and a cylinder.

5. The LED lamp lens structure of claim 1, wherein the three-dimensional shape of the peripheral protuberance is selected from the group of a part of a hemisphere, a cone, and a cylinder.

* * * * *